(12) United States Patent
Schmidt (10) Patent No.: US 10,056,872 B2
(45) Date of Patent: Aug. 21, 2018

(54) DISTRIBUTED VEHICLE AUDIO SYSTEM

(71) Applicant: Harman International Industries, Incorporated, Stamford, CT (US)

(72) Inventor: James Schmidt, Detroit, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 15/295,823

(22) Filed: Oct. 17, 2016

(65) Prior Publication Data

US 2017/0280242 A1 Sep. 28, 2017

Related U.S. Application Data

(60) Provisional application No. 62/313,035, filed on Mar. 24, 2016.

(51) Int. Cl.
*H03G 3/30* (2006.01)
*H04R 27/00* (2006.01)
*H04S 7/00* (2006.01)

(52) U.S. Cl.
CPC .......... *H03G 3/3005* (2013.01); *H04R 27/00* (2013.01); *H04R 2227/003* (2013.01); *H04R 2499/13* (2013.01); *H04S 7/30* (2013.01)

(58) Field of Classification Search
CPC .......... H04R 29/04; H04R 29/008; H04R 1/10
USPC .................. 381/58, 92, 120, 74, 56, 122
See application file for complete search history.

(56) References Cited

U.S. PATENT DOCUMENTS

| | | | | |
|---|---|---|---|---|
| 2002/0072816 | A1* | 6/2002 | Shdema | H04L 12/2805 700/94 |
| 2009/0016549 | A1* | 1/2009 | French | G06F 1/266 381/120 |
| 2013/0072816 | A1* | 3/2013 | Girgenti | A61B 10/0275 600/567 |
| 2013/0339483 | A1* | 12/2013 | Olsen | H04L 65/1069 709/217 |

* cited by examiner

*Primary Examiner* — Melur Ramakrishnaiah
(74) *Attorney, Agent, or Firm* — Artegis Law Group, LLP (57) ABSTRACT

A system for controlling an audio device that includes a memory storing an audio processing application and a processor that is coupled to the memory. When executing the audio processing application, the processor is configured to determine an amplifier parameter based on an audio signal, encode the amplifier parameter to generate an audio waveform, and transmit the audio waveform to an amplifier.

20 Claims, 6 Drawing Sheets

DISTRIBUTED VEHICLE AUDIO SYSTEM

CROSS-REFERENCE TO RELATED APPLICATIONS

This application claims benefit of the U.S. provisional patent application titled "VEHICLE AUDIO SYSTEM", having Ser. No. 62/313,035, filed Mar. 24, 2016. The subject matter of this related application is hereby incorporated herein by reference.

BACKGROUND

Field of the Embodiments

The various embodiments relate generally to audio signal processing and, more specifically, to a distributed vehicle audio system.

Description of the Related Art

Traditional vehicle audio systems are typically designed around a centralized computing device, such as a vehicle infotainment unit, that includes one or more processors, digital signal processors (DSPs), and amplifiers. Speakers and microphones distributed throughout the vehicle are then coupled to this centralized computing device via cables that are routed through various panels and conduit included in the vehicle.

Although these traditional audio systems enable a high-quality, multi-channel audio experience to be generated within a vehicle, the complex wiring and hardware requirements associated with such systems makes the systems expensive and can significantly increase the weight of the vehicle. For example, current vehicle audio systems may implement more than a dozen speakers and microphones, each of which must be connected to the vehicle infotainment unit via a separate cable. Further, because a vehicle infotainment unit is typically located at the front of the vehicle, a large number of cables must be routed through the door panels, center console, and/or floor panels to the speakers and microphones distributed throughout the vehicle.

In order to reduce the cabling and wiring requirements associated with traditional vehicle audio systems, some vehicle audio systems include multiple audio amplifiers, each of which is positioned closer to the speaker(s) driven by that amplifier. The audio amplifiers are then coupled to one another via a digital audio bus, which enables multiple audio channels to be transmitted to the amplifiers located throughout the vehicle via one or more digital interconnects. Because each amplifier can be positioned closer to the speaker(s) that are driven by the amplifier, speaker cable lengths can be significantly reduced. Further, locating multiple audio amplifiers throughout the vehicle allows the size and weight of the hardware components to be more evenly distributed, reducing space-related constraints and enabling heat to be dissipated from the various components more efficiently.

One drawback of the above approach is that each amplifier requires a one or more separate processors and/or DSPs to communicate with the vehicle infotainment unit and to control and manage functions associated with the sound system. Consequently, such systems are often more expensive to implement, consume more power, and require more complex software to synchronize audio processing functions distributed among the different amplifiers.

As the foregoing illustrates, more effective techniques for implementing a distributed vehicle audio system would be useful.

SUMMARY

Embodiments of the present disclosure set forth a system for controlling an audio device. The system includes a memory storing an audio processing application and a processor that is coupled to the memory. When executing the audio processing application, the processor is configured to determine an amplifier parameter based on an audio signal, encode the amplifier parameter to generate an audio waveform, and transmit the audio waveform to an amplifier.

Further embodiments provide, among other things, a method and a non-transitory computer readable medium for implementing aspects of the system set forth above.

Advantageously, the disclosed techniques enable advanced functions to be implemented with an amplifier without requiring the amplifier itself to include a microprocessor or DSP. Accordingly, the overall cost, power consumption, and software complexity of an audio system can be reduced.

BRIEF DESCRIPTION OF THE SEVERAL VIEWS OF THE DRAWINGS

So that the manner in which the recited features of the one or more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

DETAILED DESCRIPTION

In the following description, numerous specific details are set forth to provide a more thorough understanding of the embodiments of the present disclosure. However, it will be apparent to one of skill in the art that the embodiments of the present disclosure may be practiced without one or more of these specific details.

System Overview

Figure 1:
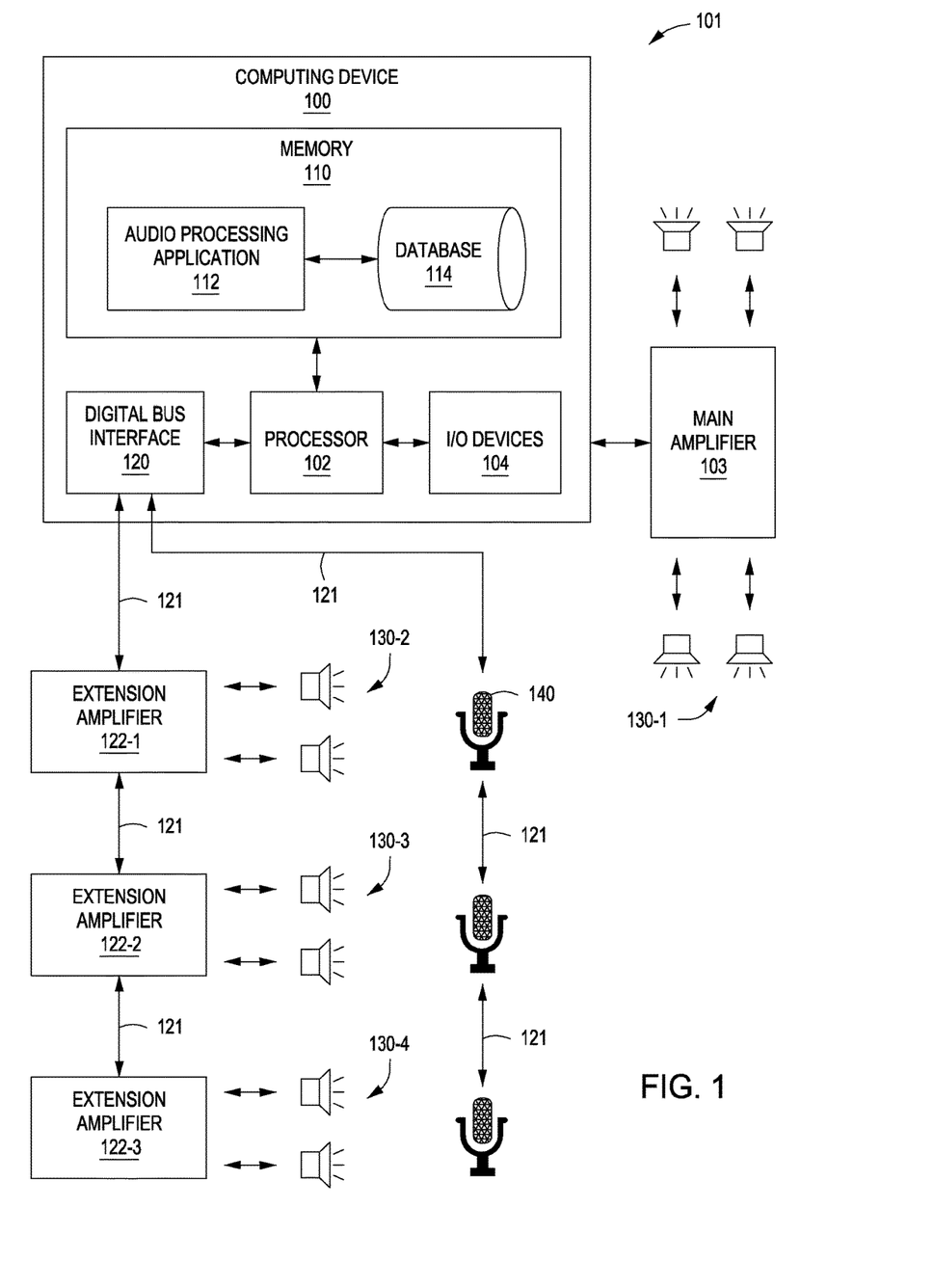
FIG. 1 is a conceptual block diagram of a vehicle audio system configured to implement one or more aspects of the various embodiments.

FIG. 1 is a conceptual block diagram of a vehicle audio system 101 configured to implement one or more aspects of the various embodiments. As shown, the vehicle audio system 101 includes a computing device 100, a main amplifier 103, one or more extension amplifiers 122, speakers 130, and one or more microphones 140. The computing device 100 includes a processor 102, input/output (I/O) devices 104, a memory 110, and a digital bus interface 120. The memory 110 includes an audio processing application 112 configured to interact with a database 114.

As described above, in order to reduce the length of wiring between a main computing device (e.g., a vehicle infotainment system) and the speakers and microphones located throughout a vehicle, some vehicle audio systems implement multiple audio amplifiers. More specifically, multiple amplifiers may be distributed throughout the vehicle such that each amplifier is positioned more closely to the speaker(s) driven by the amplifier. The audio amplifiers are then coupled to one another via a digital bus, which transmits multiple audio channels to the amplifiers via a relatively lightweight digital cable.

Although locating multiple audio amplifiers throughout a vehicle allows the size, weight, and heat associated with the amplifiers to be more evenly distributed, such configurations have several downsides. In particular, although the digital bus that couples the amplifiers to one another is capable of transmitting high-quality digital audio signals, in order to perform more advanced processing with the digital audio signals, each amplifier must include one or more separate processors and/or DSP(s). For example, each amplifier is able to receive, convert, and amplify audio signals transmitted over the digital bus, but implementing advanced functionality such as boosting the amplifier power supply based on incoming audio signals typically requires additional processing components. However, as discussed above, implementing separate processor(s) and/or DSP(s) in each amplifier is costly and increases both power consumption and the complexity of the software required to manage and synchronize the overall system.

In order to address these and other shortcomings, in various embodiments, processing associated with one or more advanced functions of the vehicle audio system 101 is performed by the computing device 100. The resulting control signals are then encoded as one or more audio signals, which are transmitted to one or more extension amplifiers 122 via the digital bus 121. A low-power circuit on each extension amplifier 122 then receives the audio signals from the digital bus and converts the audio signals back into control signals, enabling advanced functions to be performed by the extension amplifiers 122, without requiring a separate processor or DSP to be included in each extension amplifier 122. Accordingly, various embodiments described herein enable processing of audio signals and other functions to be separated from power amplification. Examples of such techniques are described below in further detail in conjunction with FIGS. 3A, 3B, 4, and 5.

Returning to FIG. 1, the computing device 100 is optionally coupled to a main amplifier 103, which may be located proximate to the computing device 100 and coupled to the computing device 100 via conventional audio interconnects (e.g., via digital interconnects, RCA interconnects transmitting line level audio signals, etc.). Additionally, one or more extension amplifiers 122 may be coupled to the computing device 100 and positioned at different locations within the vehicle, such as proximate to the speaker(s) 130 that are driven by the extension amplifiers 122. In some embodiments, the extension amplifiers 122 are coupled to the computing device 100 via a digital bus interface 120 and one or more digital busses 121, such as an A$^2$B® interface controller and bus developed by Analog Devices, Inc. In other embodiments, any type of digital bus 121 may be implemented.

For example, and without limitation, the digital bus interface 120 may include a transceiver that receives inputs from the processor 102, encodes the received input, and transmits the encoded signals to one or more extension amplifiers 122. In some embodiments, the digital bus interface 120 receives input from the processor 102 via an Inter-Integrated Circuit (PC) bus, a general-purpose input/output (GPIO) interface, and/or an audio interface. In such embodiments, the I$^2$C bus may be implemented by the processor 102 to configure the extension amplifier(s) 122, and the GPIO interface may be implemented by the processor 102 to monitor the status of the extension amplifier(s) 122. Further, in various embodiments, the processor 102 may transmit status signals to the entire vehicle audio system 101 via one or more digital busses 121 so that the extension amplifier(s) 122 and other components in the vehicle audio system 101 can respond uniformly to status changes, such as system mute/unmute, fault mode behaviors, etc. In addition, the audio interface may be implemented by the processor 102 to transmit audio signals to the power amplifiers associated with the extension amplifier(s) 122.

Local clock circuitry (e.g., phase-locked-loop (PLL)) may be implemented by the main amplifier 103 and/or each extension amplifier 122 to account for time windows during which the clock of the digital bus 121 is offline, for example, during startup and fault modes. In some embodiments, the computing device 100 is able to detect faults, such as disconnection or shorts, via the digital bus(ses) 121. The digital bus(ses) 121 may be considered to be offline when in a fault mode. Additionally, extension amplifiers 122 may include a circuit that mutes the output of the extension amplifier 122 when the digital bus(ses) 121 are offline. In such embodiments, the circuit may transition to mute gracefully, such as by ramping down slew when transitioning from unmute to mute. The local clock circuitry (e.g., a PLL circuit) on an extension amplifier 122 may maintain the digital bus clock in the event of a fault, allowing the extension amplifier 122 to smoothly slew to mute after the fault.

In order to ensure that the extension amplifier(s) 122 function properly with one another, the vehicle audio system 101 may synchronize waveform sample clocks and/or perform sample rate conversion on audio signals transmitted via the digital bus(ses) 121. For example, and without limitation, one or more clocks of the extension amplifier(s) 122 could be synchronized with a clock of the main amplifier 103. In other embodiments, if sample rate conversion is applied to audio signals that are transmitted to the extension amplifier(s) 122, then different clocks may be implemented by the main amplifier 103 and one or more of the extension amplifiers 122.

In various embodiments, the digital bus interface 120 converts input received via the PC bus, the GPIO interface, and/or the audio interface into one or more digital signals that are transmitted to the extension amplifier(s) 122 via the digital bus 121 (e.g., A$^2$B® bus) in a manner that is substantially transparent to the processor 102. Accordingly, each of the extension amplifier(s) 122 may be operated as if the amplifiers 122 were local to the computing device 100. In some embodiments, the computing device 100 and digital bus interface 120 may be configured as a master node, and the extension amplifier(s) 122 and/or interfaces included in the extension amplifier(s) 122 may be configured as slave nodes.

Figure 2:
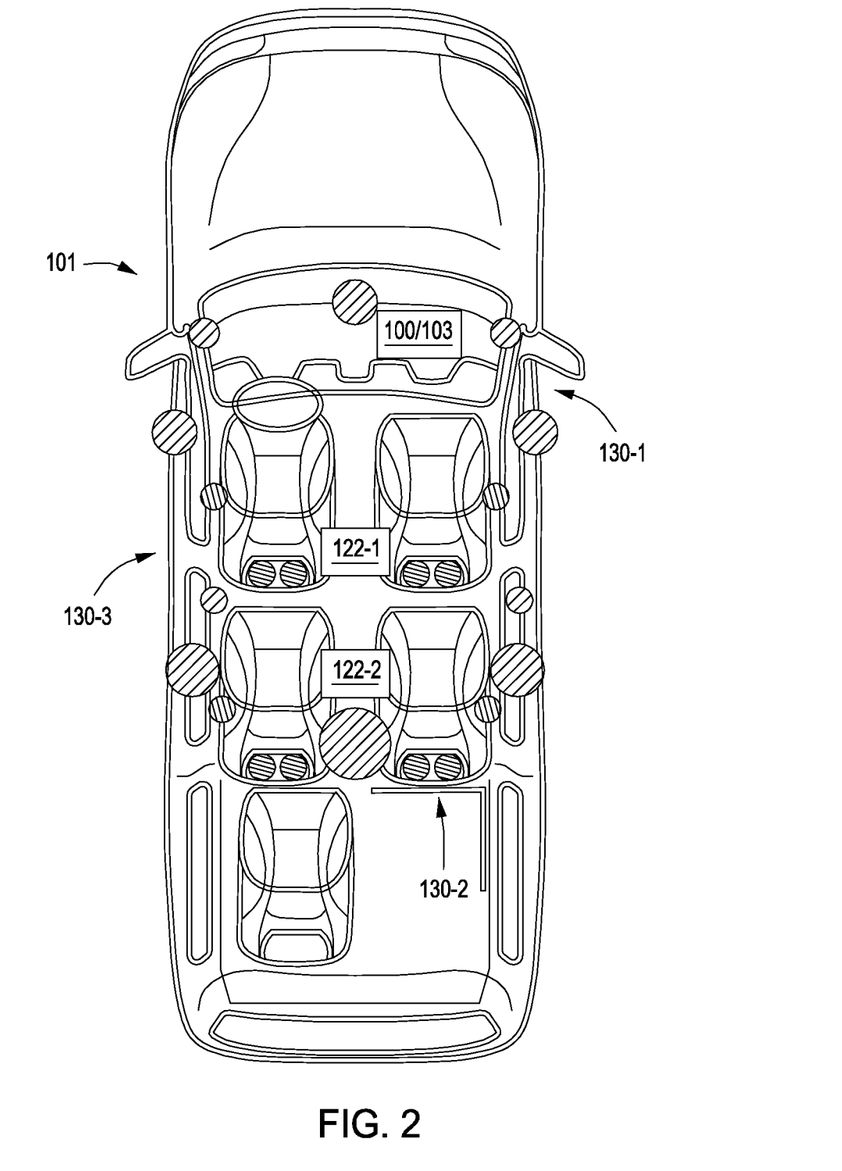
FIG. 2 illustrates a schematic view of a vehicle that includes the vehicle audio system of FIG. 1, according to various embodiments.

In various embodiments, the speakers 130 may be assigned to the main amplifier 103 or the extension amplifier(s) 122 based on proximity (e.g., in order to reduce wiring requirements), based on speaker function(s) (e.g., noise cancellation functions, different sound zones, etc.), and/or based on the system configuration or tier with which the speakers 130 and/or amplifier 103/122 are associated (e.g., standard, premium, luxury, etc.). For example, and without limitation, as shown in FIG. 2, the main amplifier 103 and a first set of speakers 130-1 may be associated with a base configuration that is a standard feature for a particular vehicle. In this base configuration, the computing device 100 and the main amplifier 103 may be located proximate to one another, for example, and without limitation, within the dashboard of the vehicle. Further, in some embodiments, the computing device 100 and the main amplifier 103 may be included in a single component, such as in a head unit or vehicle infotainment unit.

Further, extension amplifier 122-1 and the second set of speakers 130-2 and/or extension amplifier 122-2 and the third set of speakers 130-3 could be associated with one or more premium or luxury options, such as noise cancellation and/or individual sound zones, that are not included in the base configuration of the vehicle. In some embodiments, extension amplifier 122-1 and/or extension amplifier 122-2 could be disposed proximate to the speakers 130 that are powered by each extension amplifier 122-1, 122-2 and/or within the same vehicles structures (e.g., car seats, door panels, etc.) in which the speakers 130 are disposed. Accordingly, in various embodiments, the distributed audio system 101 may provide a modular and/or plug and play type design, enabling a variety of different configurations to be implemented more flexibly and efficiently within a vehicle.

The speakers 130 are configured to produce sounds (e.g., music, notifications, voices, inverse waveforms, etc.) based on signals that are generated by the computing device 100 and/or other signals that are transmitted to the speakers 130. Although FIG. 1 illustrates the main amplifier 103 as being coupled to four speakers 130 and each extension amplifier 122 as being coupled to only two speakers 130, in other embodiments, any number of speakers 130 may be coupled to the main amplifier 103 and to each extension amplifier 122. Additionally, in various embodiments, the main amplifier 103 and each extension amplifier 122 may include any number of audio channels.

The microphones 140 included in the vehicle audio system 101 are configured to acquire acoustic data (e.g., noise) from the surrounding environment and transmit signals associated with the acoustic data to the computing device 100. In some embodiments, the acoustic data acquired by the microphones 140 may be processed by the computing device 100 to determine and/or adjust noise cancellation signals produced by the speakers 130. In general, the microphones 140 may include any type of transducer capable of acquiring acoustic data including, for example and without limitation, a differential microphone, a piezoelectric microphone, an optical microphone, etc.

The processor 102 may be any technically feasible form of processing device configured to process data and execute program code. The processor 102 could include, for example, and without limitation, a system-on-chip (SoC), a central processing unit (CPU), a graphics processing unit (GPU), an application-specific integrated circuit (ASIC), a digital signal processor (DSP), a field-programmable gate array (FPGA), and so forth.

Memory 110 may include a memory module or a collection of memory modules. The audio processing application 112 within memory 110 is executed by the processor 102 to implement the overall functionality of the computing device 100 and, thus, to coordinate the operation of the vehicle audio system 101 as a whole. For example, and without limitation, the audio processing application 112 may analyze audio signals to be reproduced by the extension amplifiers 122 and corresponding speakers 130 in order to determine one or more control signals. The audio processing application 112 could then encode the control signals as audio signals based on one or more algorithms stored in the database 114 and transmit the encoded audio signals to one or more extension amplifiers 122 via the digital interface bus 120. Other types of functions performed by the audio processing application 112 may include, for example, and without limitation, multiplexing/demultiplexing, filtering, amplification, attenuation, noise cancellation, audio signal processing, and/or other types of auditory processing and enhancements.

I/O devices 104 may include input devices, output devices, and devices capable of both receiving input and providing output. For example, and without limitation, I/O devices 104 could include wired and/or wireless communication devices that send data to and/or receive data from the main amplifier 103 and/or extension amplifiers 122 included in the vehicle audio system 101.

Generally, computing device 100 is configured to coordinate the overall operation of the vehicle audio system 101. In other embodiments, the computing device 100 may be coupled to, but separate from other components of the vehicle audio system 101. In some embodiments, the computing device 100 may be included in a separate device, such as a personal computer, wearable device, smartphone, portable media player, etc. However, the embodiments disclosed herein contemplate any technically feasible system configured to implement the functionality of the vehicle audio system 101. Further, although the vehicle audio system 101 is described in conjunction with an automobile cabin, the vehicle audio system 101 may be implemented in any type of listening environment.

Figure 3A:
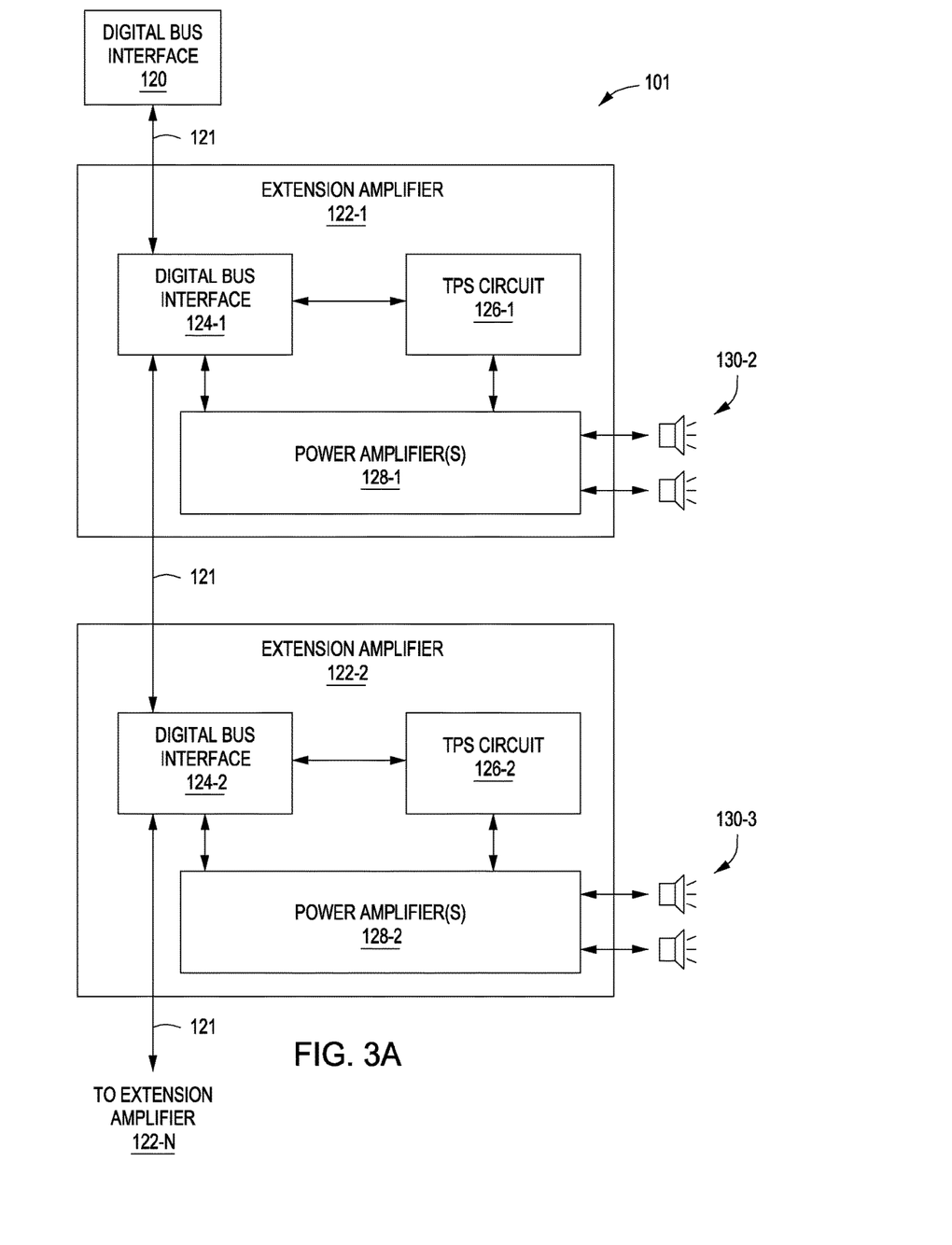
FIGS. 3A and 3B illustrate conceptual diagrams of extension amplifiers included in the vehicle audio system of FIG. 1, according to various embodiments.
Figure 3B:
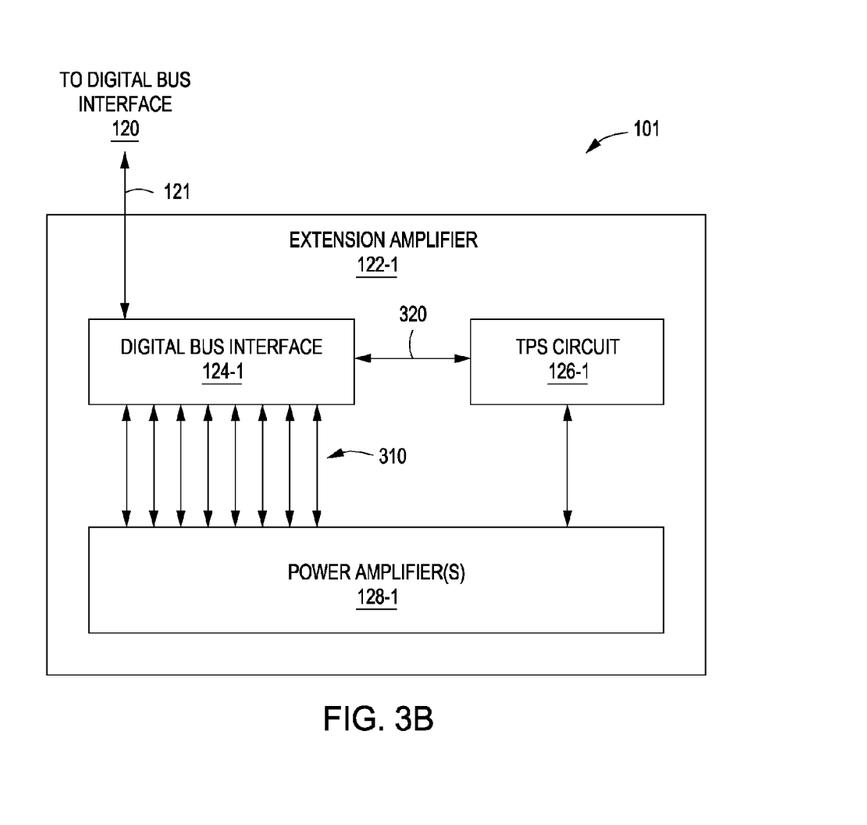

FIGS. 3A and 3B illustrate conceptual diagrams of extension amplifiers 122 included in the vehicle audio system 101, according to various embodiments. As shown, each extension amplifier 122 may include a digital bus interface 124, a tracking power supply (TPS) circuit 126, and a power amplifier 128. In various embodiments, the TPS circuit 126 comprises a low-power circuit and/or a dedicated circuit for controlling a voltage of the power amplifier 128, such as an application-specific integrated circuit (ASIC). In some embodiments, the tracking power supply (TPS) circuit 126 included in each extension amplifier 122 is coupled to an advisory channel that enables the computing device 100 to control the extension amplifiers 122. Further, the advisory channel may be clock-aligned with audio samples received by the extension amplifiers 122. In some embodiments, the extension amplifier(s) 122 are coupled to the digital bus interface 120 of the computing device 100 in a serial manner, such as in the master/slave configuration described above.

As described above, in various embodiments, the digital bus interface 120 associated with the computing device 100 receives a plurality of audio channels from the processor 102 and encodes (e.g., multiplexes) the audio channels into a digital signal that can be transmitted via the digital bus 121. The digital bus interface 124 included in each extension amplifier 122 then receives, via the digital bus 121, the digital signals that correspond to the extension amplifier 122 and decodes the digital signals into one or more audio channels. The audio channel signals are then passed to the power amplifier(s) 128 included in the extension amplifier 122, which amplify the audio channel signals and output the amplified signals to the speakers 130.

In various embodiments, in order to implement advanced functions with extension amplifier(s) 122 that do not include separate processors or DSPs, the audio processing application 112 may analyze one or more audio signals generated by the processor 102 prior to (or proximate to) transmitting audio signals to the digital bus interface 120. In some embodiments, the audio processing application 112 analyzes audio signal(s) associated with one or more audio channels to determine a level of boost (e.g., a voltage) to apply when amplifying the audio signal(s) via a power amplifier 128. For example, in order to conserve power in mobile applications, a low voltage may be applied to the power amplifier(s) 128 when a level associated with an audio signal is low, and a higher voltage may be applied to the power amplifier(s) 128 when a level associated with an audio signal is high. Accordingly, once the audio processing application 112 determines an appropriate boost level associated with one or more audio signals, the boost level is encoded as an audio waveform and transmitted to the digital bus interface 120. The digital bus interface 120 receives the audio waveform and encodes the audio waveform with the other audio channels to generate a digital signal that is transmitted to one or more extension amplifiers 122 via the digital bus 121.

For example, and without limitation, the digital bus interface 120 included in the computing device 100 could receive the audio waveform associated with the boost level and eight channels of digital audio from the audio processing application 112. The digital bus interface 120 could then multiplex the nine channels (e.g., one boost control channel and eight audio channels) into a digital signal and transmit the digital signal over the digital bus 121. Then, as shown in FIG. 3B, upon receiving the digital signal, digital bus interface 124-1 included in extension amplifier 122-1 could demultiplex the digital signal, pass the boost control channel to the TPS circuit 126-1 and pass the eight audio channels to the power amplifier(s) 128. Accordingly, the audio processing application 112 is able to control the TPS circuit(s) 126 and boost level of the power amplifier(s) 128 by encoding the boost level as an audio waveform and transmitting the encoded waveform to a TPS circuit 126 via the digital bus 121.

Various types of processing may be performed by the audio processing application 112 to encode the boost level into an audio waveform that can be transmitted via the digital bus 121. In some embodiments, the boost level may be encoded as the amplitude, power, and/or frequency of the audio waveform. For example, and without limitation, a voltage of 0 V could be encoded as a waveform having an amplitude of 0%, a normal operating voltage of 14 V could be encoded as a waveform having an amplitude of 50%, and a boosted voltage of 24 V could be encoded as a waveform having an amplitude of 100%. In such embodiments, upon receiving an audio waveform having an amplitude of 0%, 50%, or 100% from the digital bus interface 124-1, the TPS circuit 126-1 would set the voltage of the power amplifier(s) 128-1 to 0V, 14 V or 24 V, respectively. In some embodiments, the audio processing application 112 may determine, encode, and transmit a boost level to the TPS circuit 126 for each audio sample timeframe, enabling a high-degree of control over the voltage supplied to the power amplifier(s) 128 and further improving power savings.

Figure 4:
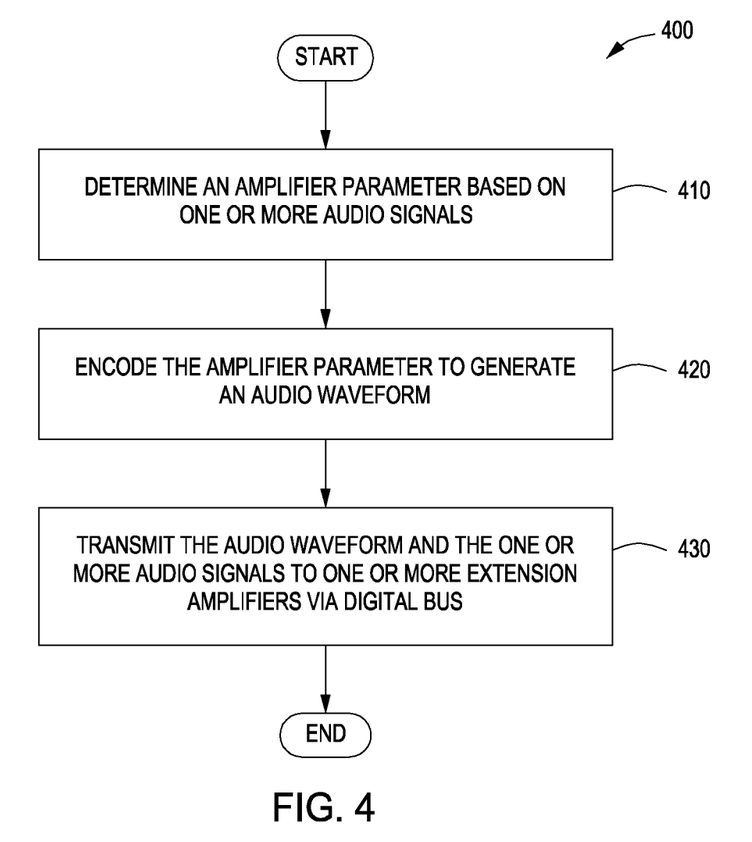
FIG. 4 is a flow diagram of method steps for controlling an audio device via an encoded audio waveform, according to various embodiments.

FIG. 4 is a flow diagram of method steps for controlling an audio device, according to various embodiments. Although the method steps are described in conjunction with the systems of FIGS. 1-3B, persons skilled in the art will understand that any system configured to perform the method steps, in any order, falls within the scope of the various embodiments.

As shown, a method 400 begins at step 410, where the audio processing application 112 determines an amplifier parameter based on one or more audio signals. For example, and without limitation, the audio processing application 112 could receive an audio signal associated with one or more audio sample timeframes and analyze the audio signal to determine one or more characteristics of the audio signal, such as an amplitude, power, frequency, etc. of the audio signal. The audio processing application 112 could then determine an amplifier parameter, such as an amplifier voltage (e.g., a boost level) that should be supplied to an extension amplifier 122 when amplifying the audio signal.

At step 420, the audio processing application 112 encodes the amplifier parameter to generate an audio waveform. For example, and without limitation, the audio processing application 112 could encode an amplifier voltage determined at step 410 as an audio waveform having a specific amplitude, power, and/or frequency. Next, at step 430, the audio processing application 112 transmits the audio waveform and, optionally, the audio signal to one or more extension amplifiers 122 via the digital bus 121. For example, and without limitation, the audio processing application 112 could pass the audio waveform and the audio signal to the digital bus interface 120, which could convert (e.g., multiplex) the audio waveform and audio signal into a digital signal for transmission via the digital bus 121. The method 400 then terminates.

Figure 5:
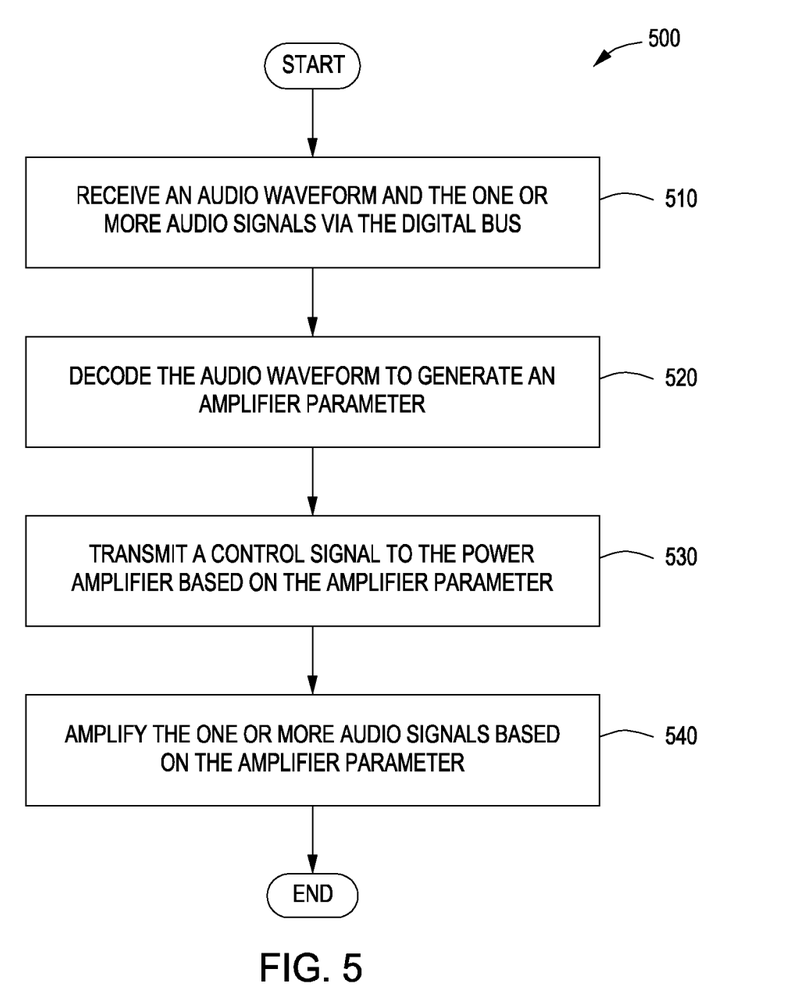
FIG. 5 is a flow diagram of method steps for modifying an amplifier parameter based on an encoded audio waveform, according to various embodiments.

FIG. 5 is a flow diagram of method steps for modifying an amplifier parameter, according to various embodiments. Although the method steps are described in conjunction with the systems of FIGS. 1-4, persons skilled in the art will understand that any system configured to perform the method steps, in any order, falls within the scope of the various embodiments.

As shown, a method 500 begins at step 510, where a digital bus interface 124 receives a digital signal via the digital bus 121, converts (e.g., demultiplexes) the digital signal into an audio waveform and one or more audio signals, and transmits the audio waveform to a control circuit (e.g., TPS circuit 126). At step 520, the control circuit decodes the audio waveform to generate an amplifier parameter, such as an amplifier voltage.

Next, at step 530, the control circuit generates a control signal based on the amplifier parameter and transmits the control signal to a power amplifier 128. For example, and without limitation, at step 530, the control circuit could generate a control signal that modifies a voltage (e.g., a boost level) of the power amplifier 128 based on a voltage specified by the amplifier parameter. Then, at step 540, the power amplifier 128 amplifies one or more audio signals, such as the audio signal(s) received at step 510, based on the amplifier parameter. The method 500 then terminates.

In sum, an audio processing application determines an amplifier parameter. The audio processing application then encodes the amplifier parameter to generate an audio waveform and transmits the audio waveform to one or more extension amplifiers via a digital bus. Next, an extension amplifier receives the digital signal from the digital bus, and a circuit associated with the extension amplifier decodes the audio waveform to generate the amplifier parameter. The extension amplifier then amplifies one or more audio signals based on the amplifier parameter.

One advantage of the techniques described herein is that advanced functions can be implemented with an amplifier without requiring the amplifier itself to include a microprocessor or DSP. Accordingly, the overall cost, power consumption, and software complexity of an audio system can be reduced.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A system for controlling an audio device, the system comprising:
   a memory storing an audio processing application;
   a processor that is coupled to the memory and, when executing the audio processing application, is configured to:
      determine an amplifier parameter based on an audio signal;
      encode the amplifier parameter to generate an audio waveform; and
      transmit the audio waveform to an amplifier.

2. The system of claim 1, wherein the amplifier parameter comprises an amplifier voltage.

3. The system of claim 2, wherein the amplifier voltage comprises a boosted voltage.

4. The system of claim 1, wherein an amplitude of the audio waveform is proportional to the amplifier parameter.

5. The system of claim 1, wherein the processor is further configured to transmit the audio signal to the amplifier.

6. The system of claim 1, wherein transmitting the audio waveform to the amplifier comprises transmitting the audio waveform via a first digital bus interface.

7. The system of claim 6, further comprising the first digital bus interface, wherein the first digital bus interface is configured to convert the audio signal and the audio waveform into a digital signal and transmit the digital signal to a second digital bus interface associated with the amplifier.

8. A non-transitory computer-readable storage medium including instructions that, when executed by a processor, configure the processor to perform the steps of:
   determining a first amplifier voltage based on a first audio signal;
   encoding the first amplifier voltage to generate a first audio waveform; and
   transmitting the first audio waveform via a digital bus.

9. The non-transitory computer-readable storage medium of claim 8, wherein the first amplifier voltage comprises a boosted voltage.

10. The non-transitory computer-readable storage medium of claim 8, further comprising determining a second amplifier voltage based on a second audio signal, wherein the first audio signal and the second audio signal comprise consecutive audio sample timeframes, and the first amplifier voltage is different than the second amplifier voltage.

11. The non-transitory computer-readable storage medium of claim 10, further comprising encoding the second amplifier voltage to generate a second audio waveform, and transmitting the second audio waveform via the digital bus, wherein the first amplifier voltage comprises a boosted voltage, and the second amplifier voltage comprises a non-boosted voltage.

12. The non-transitory computer-readable storage medium of claim 8, wherein an amplitude of the first audio waveform is proportional to the first amplifier voltage.

13. An audio device, the audio device comprising:
a bus interface;
a power amplifier coupled to the bus interface; and
a control circuit coupled to the bus interface and the power amplifier, the control circuit configured to:
receive an audio waveform via the bus interface;
decode the audio waveform to generate an amplifier parameter associated with the power amplifier; and
transmit a control signal to the power amplifier based on the amplifier parameter.

14. The audio device of claim 13, wherein the amplifier parameter comprises an amplifier voltage.

15. The audio device of claim 13, wherein the bus interface is configured to receive a digital signal from a digital bus and convert the digital signal into the audio waveform and one or more audio signals.

16. The audio device of claim 15, wherein the bus interface is further configured to transmit the one or more audio signals to the power amplifier and transmit the audio waveform to the control circuit.

17. The audio device of claim 16, wherein, in response to the control signal, the power amplifier is configured to amplify the one or more audio signals based on a boost voltage.

18. The audio device of claim 13, wherein the control circuit comprises an application-specific integrated circuit (ASIC).

19. The audio device of claim 13, wherein bus interface comprises a digital bus interface, and the digital bus interface is configured to receive a digital signal from a digital bus, convert a first portion of the digital signal to generate the audio waveform and one or more audio signals, and transmit a second portion of the digital signal to a second digital bus interface associated with a second audio amplifier.

20. The audio device of claim 13, wherein the audio amplifier does not include a microprocessor.

* * * * *